(12) United States Patent
Suto et al.

(10) Patent No.: US 10,955,465 B2
(45) Date of Patent: Mar. 23, 2021

(54) METHOD AND APPARATUS FOR BOND WIRE TESTING IN AN INTEGRATED CIRCUIT

(71) Applicant: Teradyne, Inc., North Reading, MA (US)

(72) Inventors: Anthony J. Suto, Sterling, MA (US); John Joseph Arena, Reading, MA (US); Joseph Francis Wrinn, Winchester, MA (US)

(73) Assignee: Teradyne, Inc., North Reading, MA (US)

( * ) Notice: Subject to any disclaimer, the term of this patent is extended or adjusted under 35 U.S.C. 154(b) by 140 days.

(21) Appl. No.: 16/132,292

(22) Filed: Sep. 14, 2018

(65) Prior Publication Data
US 2020/0088785 A1 Mar. 19, 2020

(51) Int. Cl.
*G01R 31/28* (2006.01)
*H01L 23/00* (2006.01)
*G01R 27/26* (2006.01)

(52) U.S. Cl.
CPC ..... *G01R 31/2853* (2013.01); *G01R 27/2605* (2013.01); *H01L 24/48* (2013.01); *H01L 24/49* (2013.01); *H01L 2224/48227* (2013.01); *H01L 2224/49175* (2013.01); *H01L 2924/30105* (2013.01)

(58) Field of Classification Search
CPC . G01R 31/2853; G01R 27/2605; H01L 24/48; H01L 24/49; H01L 2924/30105; H01L 2224/48227
See application file for complete search history.

(56) References Cited

U.S. PATENT DOCUMENTS

| | | | | |
|---|---|---|---|---|
| 5,138,266 A | * | 8/1992 | Stearns | G01R 31/2805 324/537 |
| 5,559,427 A | * | 9/1996 | Hinds | H04L 43/50 324/66 |
| 5,744,967 A | * | 4/1998 | Sorensen | G01R 31/50 324/540 |

(Continued)

FOREIGN PATENT DOCUMENTS

JP 2013-225535 A 10/2013

OTHER PUBLICATIONS

Ming et al., Electrical Package Defect Testing for Volume Production. IEEE International Test Conference. 2015. 9 pages.

(Continued)

*Primary Examiner* — Patrick Assouad
*Assistant Examiner* — Demetrius R Pretlow
(74) *Attorney, Agent, or Firm* — Wolf, Greenfield & Sacks, P.C.

(57) ABSTRACT

Disclosed herein are testing apparatus and methods to identify latent defects in IC devices based on capacitive coupling between bond wires. Bond wires may have latent defects that do not appear as hard shorts or hard opens at the time of testing, but may pose a high risk of developing into hard shorts or hard opens over time. A latent defect may form when two adjacent bond wires are disturbed to become close to each other. According to some embodiments, capacitive coupling between a pair of pins may be used to provide an indication of a near-short latent defect between bond wires connected to the pair of pins.

19 Claims, 10 Drawing Sheets

(56) References Cited

U.S. PATENT DOCUMENTS

| | | | |
|---|---|---|---|
| 7,057,395 B1* | 6/2006 | Williamson | G01R 31/2812 |
| | | | 324/519 |
| 8,604,820 B2 | 12/2013 | Suto | |
| 8,760,183 B2 | 6/2014 | Suto | |
| 9,778,314 B2* | 10/2017 | Suto | G01R 31/312 |
| 2003/0146763 A1* | 8/2003 | Sunter | G01R 31/31855 |
| | | | 324/527 |
| 2004/0041590 A1* | 3/2004 | Bernstein | H03K 19/00338 |
| | | | 326/95 |
| 2005/0077907 A1* | 4/2005 | Parker | G01R 31/2853 |
| | | | 324/538 |
| 2009/0234353 A1* | 9/2009 | McPherson | A61B 18/16 |
| | | | 606/35 |
| 2010/0207651 A1 | 8/2010 | Suto | |
| 2011/0169522 A1* | 7/2011 | Raj | H03K 19/177 |
| | | | 326/10 |
| 2011/0210759 A1* | 9/2011 | Suto | G01R 31/2812 |
| | | | 324/754.03 |
| 2012/0032684 A1 | 2/2012 | Siddiquie et al. | |
| 2015/0331013 A1* | 11/2015 | Xue | G01R 1/0466 |
| | | | 324/756.02 |
| 2016/0054385 A1 | 2/2016 | Suto | |
| 2016/0231377 A1 | 8/2016 | Wen et al. | |
| 2016/0263768 A1* | 9/2016 | DeCicco | F16P 3/148 |
| 2017/0194285 A1 | 7/2017 | Zhu et al. | |

OTHER PUBLICATIONS

Suto, Principles of Analog In-Circuit Testing. Analog ICT. EE Evaluation Engineering. 2012. pp. 18-21.
International Search Report and Written Opinion for International Application No. PCT/US2019/050271 dated Dec. 26, 2019.

* cited by examiner

METHOD AND APPARATUS FOR BOND WIRE TESTING IN AN INTEGRATED CIRCUIT

BACKGROUND

The present application relates generally to methods and apparatus for testing integrated circuit (IC) devices. In particular, it relates to identifying IC devices likely to experience defects related to bond wires.

An IC device may be in the form of a package, or a chip, with conductive leads or pads (sometimes called "pins") on the exterior surfaces of the package. Some IC devices use bond wires to connect connection points on a substrate, such as a silicon die, to a lead frame. The lead frame, in turn, may be connected to pins of the device package. During manufacturing of ICs, testing is performed at one or more stages to ensure that the finished product functions adequately.

Testing may be performed in a semiconductor test system such as an automatic test equipment (ATE) by connecting test probes to test access points on the IC devices. The test probes are connected to test equipment to provide electrical stimulus or perform electrical measurement at the test access points. For testing semiconductor dies that will be packed to form the semiconductor devices, the test access points may be pads on the dies. For testing finished products, the test probes may be connected to pins at the exterior of the package.

Testing the packaged product may identify short circuits between bond wires or open circuits for some of the bonds wires. Such testing can identify defects that exist at the time of testing. However, some semiconductor devices may fail in use, even though testing did not identify any defect at the time of manufacture.

SUMMARY

According to some embodiments, a method of operating a test system to identify a latent defect in a device is provided. The device comprises a plurality of pins having bond wires attached thereto. The method comprises supplying a stimulus signal to the device; measuring a response to the stimulus signal. The response indicates capacitive coupling between a bond wire attached to a first pin of the plurality of pins and a bond wire attached to a second pin of the plurality of pins. The method further comprises determining whether a capacitance providing the capacitive coupling is within a predetermined range; and when the capacitance is determined to be outside the predetermined range, providing an indication that the device is likely to fail.

According to some embodiments, a method of operating a test system to identify a latent defect in a device is provided. The device comprises a plurality of pins having bond wires attached thereto. The method comprises testing the device to identify hard shorts and hard opens between a plurality of pairs of the plurality of pins; when the testing does not identify hard shorts or hard opens, testing for latent defects by, for each of the plurality of pairs of pins;measuring a fringing capacitance between a bond wire attached to first pin of the pair and a bond wire attached to a second pin of the pair; and
determining whether the fringing capacitance is within a predetermined range; and when the fringing capacitance for a pair of the plurality of pairs is determined to be outside the predetermined range, providing an indication that the device has a latent defect.

According to some embodiments, at least one non-transitory computer-readable medium is provided. The at least one non-transitory computer-readable medium is encoded with computer-executable instructions that, when executed by a processor of a test system, controls the processor to perform a method of operating a test system to identify a latent defect in a device comprising a plurality of pins having bond wires attached thereto. The method comprises for each of a plurality of pairs of the plurality of pins, configuring the test system to measure capacitance for a first pin and a second pin of the pair. The configuring comprises connecting an AC voltage source to the first pin of the pair; measuring a current flow induced by the AC voltage source; computing a capacitance providing capacitive coupling between a bond wire attached to the first pin and a bond wire attached to a second pin; determining whether the capacitance is within a predetermined range; and when the capacitance is determined to be outside the predetermined range, providing an indication that the device has a latent defect.

The foregoing is a non-limiting summary of the invention, which is defined by the appended claims.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Figure 1:
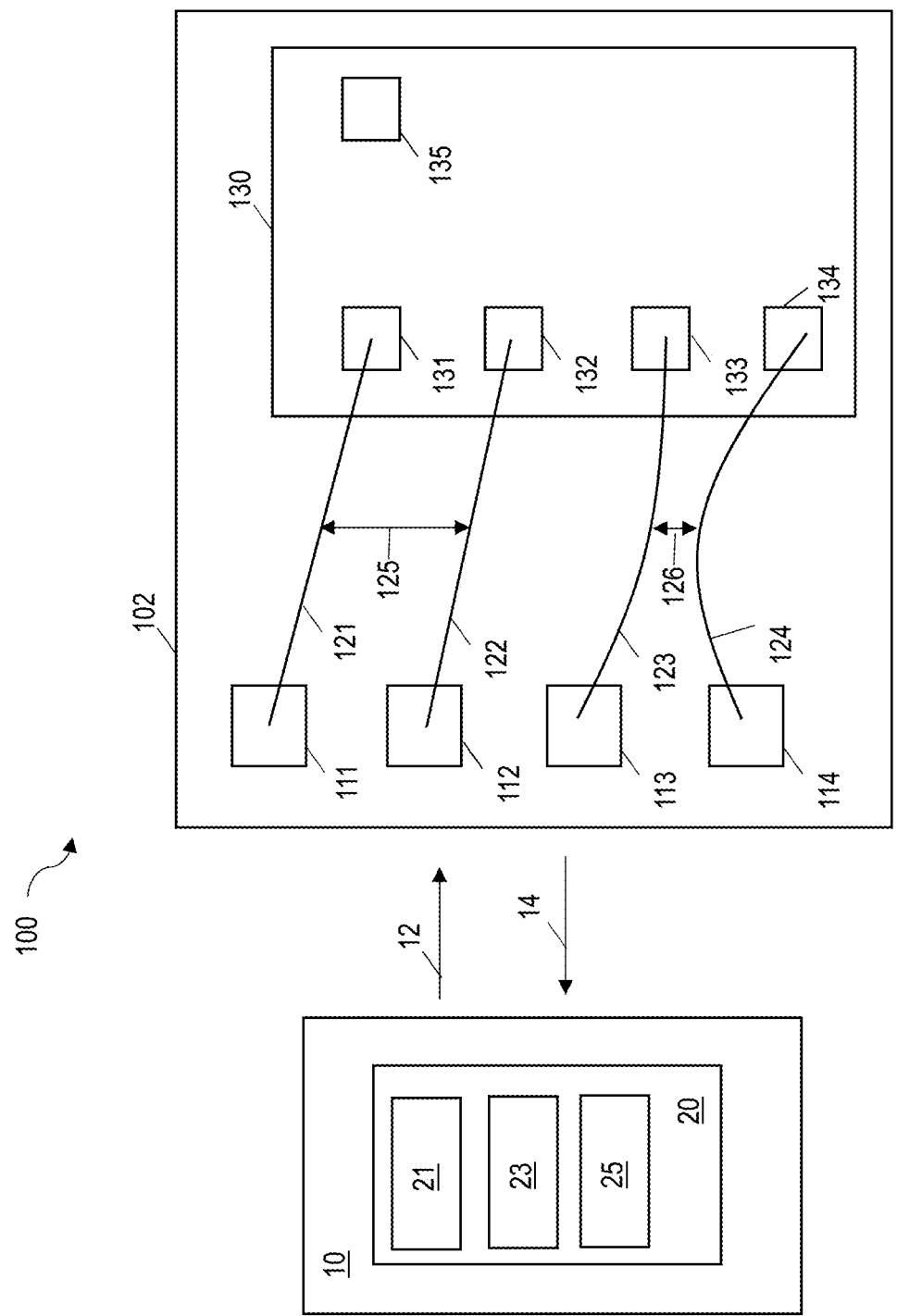
FIG. 1 is a schematic diagram illustrating a device 100 being tested using test system 10, according to some aspects of the present application.

The inventor has recognized and appreciated that certain values of capacitive coupling between certain test access points of a semiconductor device may indicate a high likelihood of a device failure in operation. Those values of capacitive coupling may be associated with an incorrect positioning of bond wires, which, in operation, may lead to a device failure. Accordingly, those values of capacitive coupling may enable classification of semiconductor devices as having latent defects that, because those defects do not exist at the time of testing during manufacture, are not detected by conventional semiconductor test techniques. Disclosed herein are testing apparatus and methods to identify such latent defects in IC devices based on capacitive coupling between bond wires.

The inventor has recognized and appreciated that, as IC functionality continues to increase, so does the pin count of a IC package and the probability of a bond wire defect. Bond wire defects may include hard shorts and hard opens. A hard short is a defect that occurs when two bond wires are electrically shorted together, for example when the bond wires inadvertently contact each other. A hard open is a defect that occurs when the bond wire is not electrically connected to the intended circuitry within the device.

Both hard shorts and a hard opens may be detected based on measurements at test access points connected to the bond wires. When an IC device is identified with a hard short or hard open defect, it may be rejected as a failed device. The inventor also has recognized and appreciated that bond wires may have latent defects that do not appear as hard shorts or hard opens at the time of testing, but may pose a high risk of developing into hard shorts or hard opens over time. For example, a latent defect may lead into a device failure when two adjacent bond wires are disturbed to come into contact with each other due to temperature variations, vibration during device handling, etc. Such latent defect may result from a "near-short." A device with a near-short has a high likelihood of failure from the near-short developing into a hard short. A near-short may also develop into a hard short when the IC device is subject to harsh environments with temperature variations and/or mechanical vibrations, for example when used in an automobile or other vehicles. It is therefore desirable to identify latent defects in IC devices during the manufacturing process prior to shipping or deploying the device. Techniques as described herein may be particularly useful for IC devices designed for use in vehicles or other environments where there will be a high degree of vibration. However, the techniques may be used on any type of device with bond wires.

Techniques as described herein provide an electrical testing method for identifying latent defects that is faster and less expensive than conventional methods available to identify such latent defects. Latent defects such as near-short in bond wires might be identified, for example, using known X-ray radiographs to image the position of each of the bond wires. However, the inventor has recognized and appreciated that the X-ray radiograph method is expensive, both in terms of capital equipment and supply costs, and down time in the manufacturing process due to the time consuming imaging process. The X-ray imaging is also prone to human error when interpreting a large quantity of image data.

The inventor has further recognized and appreciated that, bond wires in a "near-short" condition have capacitive coupling that differs than properly positioned bond wires. Though the difference in capacitance is very small, the inventor has recognized measurement techniques that enable such small differences to be identified with sufficient reliability to predict that an IC device has a high risk of failure.

According to an aspect of the present application, capacitive coupling between a pair of pins connected to adjacent bond wires may be used to provide an indication of a near-short latent defect between bond wires connected to the pair of pins. According to an aspect of the present application, because capacitance coupling between bond wires, referred to below as "fringing capacitance," is inversely proportional to the distance between the bond wires, bond wires that are proximate to each other under near-short condition will exhibit a higher amount of fringing capacitance compared to bond wires that are properly spaced. The fringing capacitance may be measured at the pins of the device that the bond wires are connected to.

According to some embodiments, to measure fringing capacitance, a stimulus signal, such as a sinusoidal or alternating current (AC) voltage signal may be supplied to the device under test, and a response to the stimulus signal may be measured. The response may indicate capacitive coupling between bond wires attached to a first pin and a second pin of the device under test. In some embodiments, the response to the AC stimulus signal may be measured in a 2-wire configuration, by measuring an AC current between a first pin and the substrate of the device under test.

In other embodiments, the response may be measured at a second pin of the device under test. In such a measurement configuration, the substrate of the IC device may be connected to a reference voltage level. The inventor has recognized and appreciated that fringing capacitance between bond wires may have a relatively small magnitude, compared to a larger parasitic background capacitance from parasitic coupling such as the coupling between pads and the substrate in the IC device. This means measurement of the fringing capacitance is a small-capacitance measurement, and an AC current path through the capacitive coupling between bond wires has a larger impedance compared to an AC current path through the parasitic background capacitance. In some embodiments, the response may be measured in a 3-wire configuration to reduce the impact of parasitic background capacitance when measuring fringing capacitance between bonds wires connected to two pins. In some embodiments, a stimulus AC voltage signal may be applied to a first pin, and a response AC current is measured at a second pin while the substrate is connected to a reference voltage. The inventor has appreciated that when the substrate is connected to a reference voltage, such as ground, response AC currents through the parasitic background capacitance will substantially flow to the reference voltage via the substrate rather than the second pin, such that the AC current measured at the second pin is based substantially on the fringing capacitance.

According to some aspects of the present application, fringing capacitance between a pair of bond wires connected to two pins may be compared to a predetermined range to determine if the device has a latent defect and is likely to fail. The predetermined range may be a static range based on an average of measured baseline capacitances between similar pins in a number of known good devices. The inventor has recognized and appreciated that IC devices may have systematic variations in characteristic parameters such as, resistance and capacitance, between devices due to manufacturing batch variations or other causes. To tolerate such process variation from device to device, the predetermined range for fringing capacitance values may be dynamically generated for each device. In some embodiments with high pin count devices, capacitive coupling is measured between a plurality of pairs of pins to established an average capacitance, and the capacitive coupling between bond wires attached to a pair of pins is normalized based on the average capacitance.

Referring to the figures, FIG. 1 is a schematic diagram illustrating a device 100 being tested using test system 10, according to some aspects of the present application. Device 100 is a device under test (DUT) that comprises a package 102. Substrate 130 is disposed within package 102 and may be silicon or other suitable substrate material with which a semiconductor die may be formed by forming circuit elements therein or thereon. Those circuit elements may be formed by creating on or in the substrate layers of semiconductor, dielectric and conductive materials so as to create various logic, memory, interconnects, movable components for micro-electromechanical (MEMS) applications, and/or other suitable types of circuit elements.

In some embodiments, device 100 may comprise more than one die within package 102. In such an embodiment, fringing capacitance between bond wires connected to each such die may be measured separately or in any other suitable way.

Package 102 may comprise a suitable ceramic, semiconductor, oxide, ceramic composite material, or a laminate of more than one materials. Such a structure may serve as a mounting location for the semiconductor die formed from substrate 130, and may serve as an enclosure for the die and other components making up that package. Leads, which may be formed as part of a lead frame, may provide electrical connections from inside to outside the package. For simplicity, FIG. 1 illustrates portions of the leads, exposed inside or outside the package, as pins.

In the example of FIG. 1, those pins are represented by pins 111, 112, 113, 114, at least a portion of which may be disposed on an exterior surface of package 102 such that they are electrically accessible from an exterior of device 100. Although four pins are shown in a linear array, it should be appreciated that a package may have any suitable number of leads and any number of pins may be placed on the outside of package 102 in any suitable arrangement. Portions of leads outside the package may have any suitable shapes and dimensions, such as a conductive pad, a metal pin, a copper pillar, or a conductive structure comprising a solder ball.

The exterior portions of the leads may be connected to portions of the leads inside package 102 to which bond wires may be attached. The portions inside package 102 similarly may be shaped as square or rectangular pads, or have any other suitable shape. The portions of leads inside and outside the package may be joined by intermediate portions that also may have any suitable shape. As the shape and position of the internal, external and intermediate portions of the pins is not critical to the invention, all portions of a lead are designated by the same symbol, which is here a square.

Substrate 130 comprises a plurality of connection points 131, 132, 133, 134, each connected to a respective pin 111, 112, 113, 114 via a respective bond wire 121, 122, 123, 124. Here, a one-to-one relationship between connection points, bond wires and pins is shown. It should be appreciated, however, that other configurations are possible, such as multiple bond wires connected to the same pin or same connection point. Moreover, it should be appreciated that none of the bond wires are shown to cross over other bond wires. It should be appreciated that an IC device may be designed in which bond wires are attached to pins and connection points that require some bond wires to pass over adjacent bond wires.

Connection points 131, 132, 133, 134 may be pads or traces on substrate 130 and electrically connected to various elements on substrate 130. Although connection points 131, 132, 133, 134 are shown in a linear array, it should be appreciated that any number of connection points may be formed on substrate 130 and in any suitable arrangement.

As shown in FIG. 1, there may be additional connection point 135 on substrate 130 that are not connected via a bond wire. For example, substrate 130 may be a silicon substrate and connection point 135 may be electrically connected to the silicon substrate 130. Connection point 135 also may be disposed on any surface of substrate 130 to provide electrical access. For example, connection point 135 may be placed at the bottom of substrate 130, such that when a bottom surface of substrate 130 is mounted mechanically on a surface of package 102, electrical connection between connection point 135 may be made via a surface of the package or via a pin on package 102 that is electrically coupled to connection point 135 to provide access to bias the substrate 102. Accordingly, it should be appreciated that, while FIG. 1 provides an example of mechanisms to make electrical connections for testing as described herein, other mechanisms to make electrical access may alternatively or additionally be used.

As shown in FIG. 1, bond wires 121, 122 are spaced from each other, such that they are separate by a distance 125, which provides for a first capacitive coupling between those bond wires. In some embodiments, bond wires 121, 122 have a proper or typical spacing from each other such that they are not likely to cause a hard short, and thus they are not positioned to create a near-short latent defect. On the other hand, bond wires 123, 124 have a shape that bend towards each other to be separated by a distance 126 that provides a second capacitive coupling, which is greater than the first capacitive coupling. In this example, distance between bond wires 123, 124 may become a hard short if they further bend to be in contact, and thus are positioned to create a near-short latent defect. According to an aspect of the present application, a determination that the second capacitive coupling between bond wires 123 and 124 is larger than expected may provide the basis for identification of the presence of latent defect in a pair of bond wires. Such a determination may be made by comparing the second capacitive coupling to the first capacitive coupling between bond wires 121 and 122, or by comparing the capacitive coupling of bond wires 123 and 124 of previously measured devices. In some embodiments, a semiconductor device is tested for latent defects by measuring capacitance between pins that connect to pairs of bond wires. The testing may be performed on all possible pairs or, in some embodiments, may be performed on a subset of the possible pairs of bond wires, such as the pairs of bond wires that are, in accordance with the design of the semiconductor device, positioned close enough that if either or both is out of place, they could create a latent defect.

Test system 10 may include components for providing a stimulus signal 12 to the device 100, and for measuring a response 14 from the device 100. Test system 10 may be configured with multiple instruments that may generate stimulus signals. Commercially available test systems contain a variety of instruments that generate and measure AC and DC signals. Moreover, test system 10 may contain timing circuitry such that the instruments that generate stimulus signals and those that measure response signals may be synchronized such that the response to specific stimulus signals may be determined. The stimulus and measured response signals may be AC signals that have amplitude and phase characteristics. In some embodiments, the signals may be determined in a phase sensitive manner. In one embodiment, the test system can calculate the orthogonal real and imaginary signal components corresponding to resistive and reactive measurement values. This allows for the capacitive current to be separated from any resistive current that may exist in a given measurement.

Moreover, a test system may contain or be operated with components that connect specific inputs and outputs of instruments within the tester to specific connection points on a device under test. These components may include switching circuits such that, at different times during a test flow, instruments may be connected to connection points on the device under test.

In a production environment, the instruments are controlled to generate and measure specific test signals at specific times, and the test system is configured such that those instruments are connected to different connection points at different times. The operation of the test system is therefore under program control. In some embodiments, test system 10 may be an ATE that comprises a computer 20 with storage media 21, memory 23, and processor 25, and such processing may be performed in computer 20 or any other computing device. Storage media 21 and memory 23 may be any suitable non-transitory computer-readable medium, such as, for example and not limited to, a computer memory, compact discs, optical discs, magnetic tapes, flash memories, circuit configurations in Field Programmable Gate Arrays or other semiconductor devices, or other tangible computer storage medium. In some embodiments, storage media 21 may be non-volatile storage and memory 23 may be volatile storage. Computer-executable instructions may be loaded from storage media 21 to memory 23 before execution by processor 25. However, a distinction between storage media 21 and memory 23 is not critical and either or both may be present in some embodiments.

Processor 25 may be any suitable processing device, such as, for example and not limited to, one or more processors, a central processing unit (CPU), digital signal processor (DSP), controller, addressable controller, general or special purpose microprocessor, microcontroller, addressable microprocessor, programmable processor, programmable controller, dedicated processor, dedicated controller, or any other suitable processing device. Moreover, it should be appreciated that FIG. 1 is a schematic representation of test system 10. An actual implementation may have distributed processing. A host computer, for example, may control the overall flow of a test and analyze results. The test system may contain one or more specialized processors that each controls an instrument or group of instruments that generates and/or measures test signals.

Figure 2A:
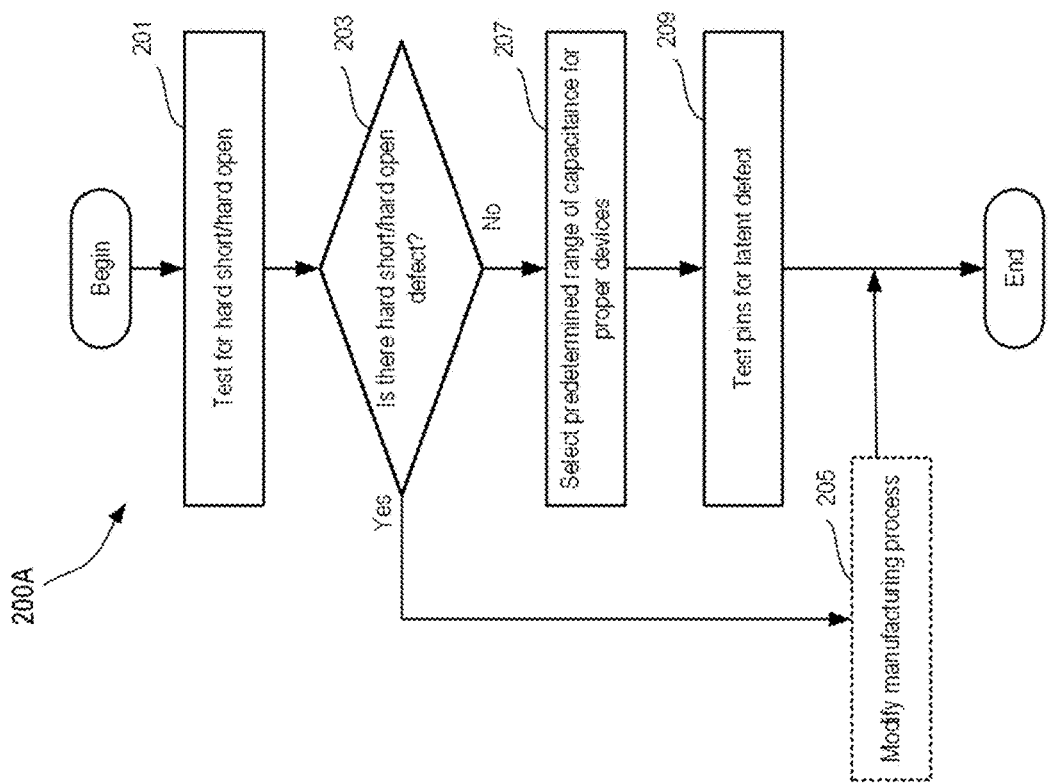
FIG. 2A is a schematic flow diagram illustrating an exemplary method 200A for operating a test system 10 to test for bond wire defects in the device 100 as shown in FIG. 1, according to some aspects of the present application.

FIG. 2A is a schematic flow diagram illustrating an exemplary method 200A for operating a test system 10 to test for bond wire defect in the device 100 as shown in FIG. 1, according to some aspects of the present application. Testing that may be performed on pins coupled to pairs of bond wires within the device under test. In some embodiments, total average test time may be shortened by preceding a test for latent defects with a test for hard opens and hard shorts in the bond wires. In the exemplary method 200A as illustrated in FIG. 2A, at act 201, the device is tested to identify hard shorts and hard opens between a portion or all pairs of the pins. Any suitable method for testing hard open or hard short may be used for this testing, such as but not limited to capacitance or impedance measurements. At act 203, if the result of act 201 indicates the presence of one or more hard short or hard open between the bond wires, method 200A proceeds to an optional act 205, where the manufacturing process may be modified to correct the hard open/hard short defect identified in act 201 in future manufacturing processes, and method 200A would end afterwards. When testing does not identify hard shorts or hard open defects, method 200A proceeds to perform a test for latent defects. At act 207, a predetermined range of capacitance is selected that is representative of expected fringing capacitance values for devices with bond wires that do not have near-short latent defects. At act 209, the device is tested at the plurality of pins for latent defects based on the predetermined range of capacitance.

Figure 2B:
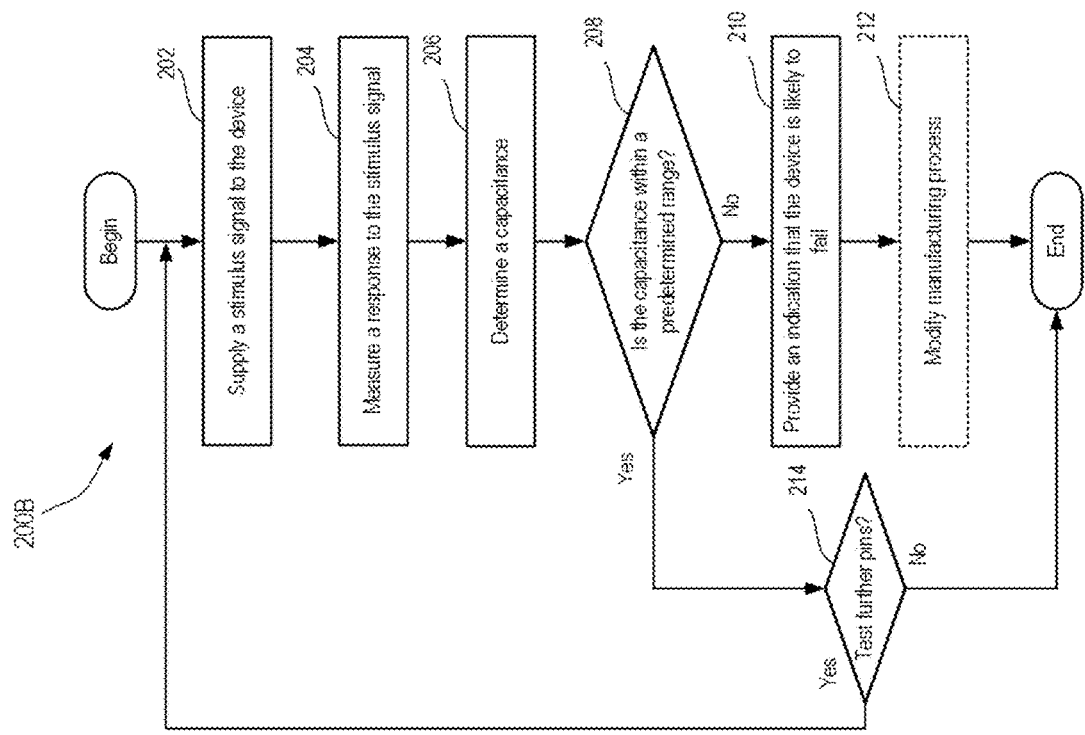
FIG. 2B is a schematic flow diagram illustrating an exemplary method 200B for operating a test system 10 to identify a latent defect in the device 100 as shown in FIG. 1, according to some aspects of the present application.

FIG. 2B is a schematic flow diagram illustrating an exemplary method 200B for operating a test system 10 to identify a latent defect in the device 100 as shown in FIG. 1, according to some aspects of the present application. Method 200B may, according to some aspects, be an exemplary implementation of act 209 in method 200A of FIG. 2A. In the embodiment illustrated in FIG. 2B, method 200B represents testing that may be performed on pairs of pins coupled to respective pairs of bond wires. A latent defect detected for that pair may reveal a latent defect for the IC device. To determine that an IC device under test does not have a latent defect, all or many of the pairs of pins that are connected to bond wires that could be close enough to create a near-short without forming a hard short or hard open, may be tested. Testing in this order may allow for the testing for near-short conditions to be omitted if a hard short or hard open is present.

As shown in FIG. 2B, at act 202, a stimulus signal 12 is supplied to device 100 from test system 10. At act 204, a response 14 is measured and received by test system 10. Response 14 as shown in FIG. 1 is indicative of capacitive coupling between bond wires, such as capacitive coupling 126 between bond wires 123, 124. Response 14 is then used to determine a value of a fringing capacitance at act 206 that provides the capacitive coupling between the pair of bond wires under test.

In some embodiments, an AC impedance method is used to measure capacitance. For example, stimulus 12 may be an AC voltage signal and response 14 may be an AC current in response to the AC voltage stimulus. An impedance value Z can then be calculated based on a division of the root mean squared (rms) value of the AC voltage signal and the AC current, which is used to calculate a capacitance C using $Z=1/(2\pi fC)$, where f is the frequency of the AC stimulus signal 12. It should be appreciated that aspects of the present application are not limited to using the AC impedance method, and that any reasonable means of supplying stimulus signal, measuring response and determining capacitance may be used in acts 202, 204 and 206. For example, a quasi-static capacitance measurement based on timed accumulation of charges on a capacitor plate may be used to measure a capacitance value between two pins.

Moreover, it should be appreciated that it is not a requirement for a measured electrical parameter to be converted, via computation, into a value of a capacitance. Rather, in some embodiments, many variables needed to compute a capacitance from a measurement may be the same from one measurement to the next, such that a value indicative of a capacitance may be based on the measurement. For example, in the equation above, the measurement frequency may be the same for all measurements, such that the capacitance may be inversely proportional to the measured impedance. In such an embodiment, a comparison of the measured impedance to a range of impedance values may be suitable to determine whether the capacitance is within a particular range.

Regardless of the specific computations used to derive a value representative of the measured capacitance, at act 208 of method 200B, the determined capacitance is compared with a predetermined range of proper fringing capacitances. If the determined capacitance value is within the predetermined range, method 200B ends and it is determined that device 100 is unlikely to fail due to a latent defect in the pair of bond wires tested. Method 200B may include determining at act 214 whether continued testing on a further pair of pins is needed. If yes, method 200B will begin back at act 202 to test a new pair of pins. If no more pins are to be tested, for example, when the plurality of pins on the device under test have all been tested for latent defects, method 200B may proceed to end.

If, on the other hand, at act 208 the determined capacitance value is found to be outside a predetermined range representing fringing capacitance for the pair of bond wires tested, then method 200B further comprises at act 210 providing an indication that the device 100 has a latent defect and is likely to fail. In some embodiments, the predetermined range may be a single ended range. For example, the range may be defined by an upper bound threshold value and a capacitance measured that is higher than that upper bound threshold may indicate a latent defect. In some other embodiments, the predetermined range may be double-ended and may include a lower bound threshold value. A capacitance measured that is lower than that lower bound threshold may indicate a latent defect, for example as an indication that a distance between the bond wires being tested is abnormally high compared to a proper distance, with an inference that the bond wire being tested may have been disturbed and likely to form near-shorts to other bond wires.

Subsequent to act 210, method 200B may optionally include act 212, where the manufacturing process may be modified to correct the latent defect in future manufacturing processes, and method 200B would end afterwards.

The stimulus 12 and measurement 14 may be made through test probes connected to the pins that are in turn coupled to the pair of bond wires being tested. FIGS. 3 and 4 illustrate two alternative ways such connections may be made.

Figure 3A:
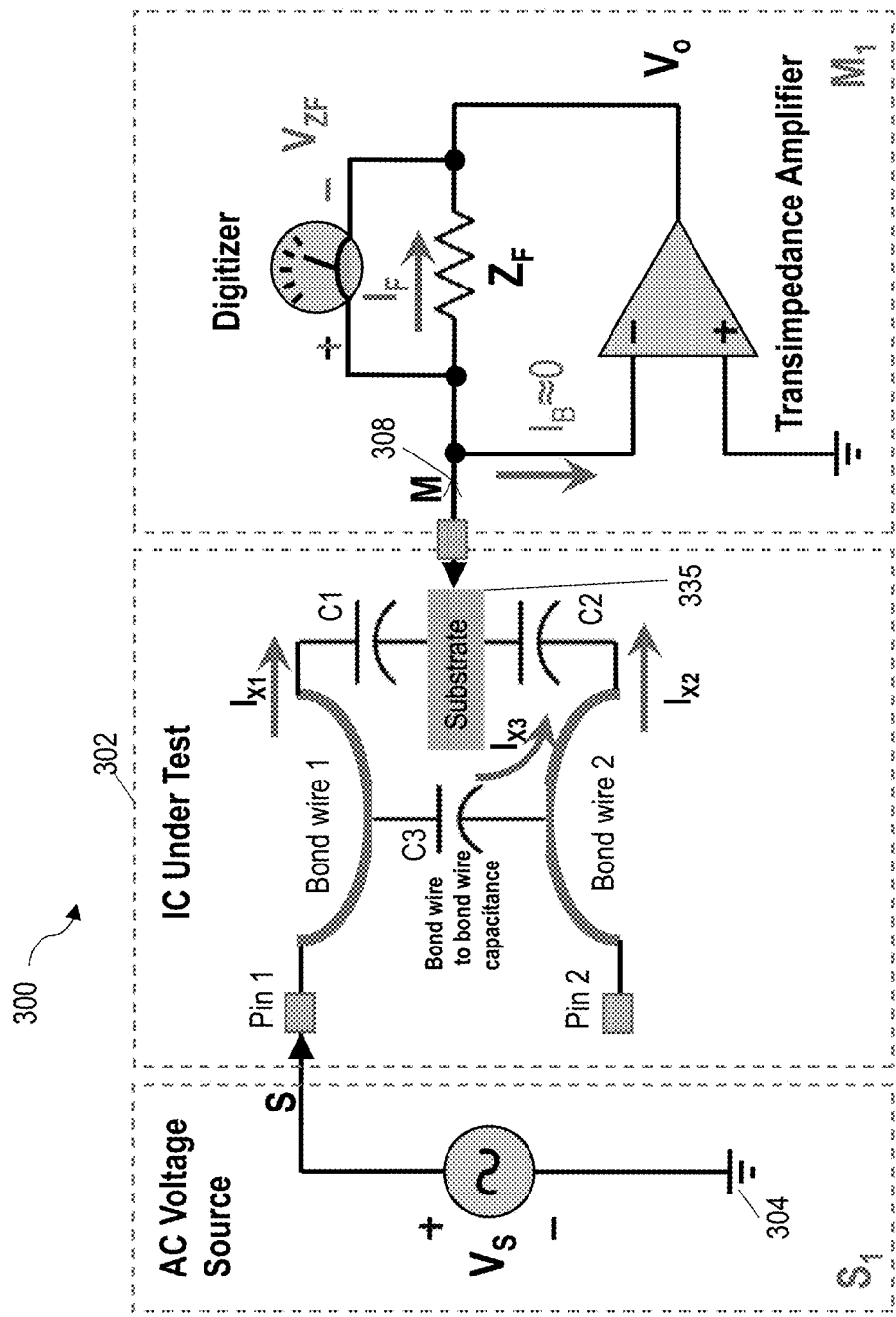
FIG. 3A is a schematic diagram that illustrates an exemplary implementation of a method of operating a test system to identify a latent defect in a device, according to some aspects of the present application.

FIG. 3A is a schematic diagram that illustrates an exemplary implementation of a method of operating a test system to identify a latent defect in a device, according to some aspects of the present application. FIG. 3A shows a device under test 300 having a first pin Pin 1 and a second pin Pin 2 on a package 302. AC voltage source $S_1$ and a transimpedance amplifier $M_1$ may be implemented by instruments inside a test system. For example, AC voltage source $S_1$ may produce stimulus signal 12 and a transimpedance amplifier $M_1$ may measure response signal 14 (FIG. 1).

Pin 1 is connected to Bond wire 1, while Pin 2 is connected to Bond wire 2. The fringing capacitance between Bond wire 1 and Bond wire 2 is C3. Bond wire 1 and Bond wire 2 are each connected also to the Substrate within package 302, and has a respective parasitic substrate capacitance C1 and C2 with the Substrate. FIG. 3A illustrates a connection of source and measurement instruments to the device under test such that a value representative of C3 including C1 and C2, may be measured.

Device 300 has a connection point 335 that electrically connects to the Substrate. In some embodiments, Substrate may be a silicon die and connection point 335 may be a pad on a side or bottom surface of the Substrate and configured to electrically connect to the silicon body within the die. However, any suitable approach for connecting to the substrate may be used.

FIG. 3A illustrates a 2-wire configuration for testing latent defects in device 300. In the example shown in FIG. 3A, an AC voltage source $S_1$ is configured to provide at a stimulus output S, an AC voltage stimulus signal $V_S$ relative to a ground voltage 304. It should be appreciated that a "ground" need not be at the potential of earth ground. Rather, a "ground" may be any voltage acting as a suitable reference.

According to an aspect of the present application, the AC voltage stimulus signal is a sinusoidal voltage signal with a frequency between 1 Hz and 500 kHz, between 100 Hz and 10 kHz, or between 1 kHz and 100 kHz (all inclusive). The inventor has recognized and appreciated that when an AC voltage is applied across a capacitor, a higher frequency would lead to a lower impedance from the capacitor and a higher AC current amplitude in response. Therefore, in some embodiments, a high voltage signal frequency may lead to higher response current amplitude, and a larger measured response signal.

According to another aspect, a peak amplitude or peak voltage of AC voltage stimulus signal $V_s$ may be kept smaller than a characteristic voltage of components that are in the substrate of the IC device 300. For example, $V_s$ may be kept smaller than a transistor turn on voltage for transistors such that the applied stimulus voltage signal does not lead to transistor turn on, which may lead to more conductive paths within device 100 that support current flow that may interfere with the measurement of small fringing capacitance C3. In some embodiments, the characteristic voltage may be a junction voltage across a p-n junction in one or more devices, such as a p-n junction across a diode within an electrostatic discharge (ESD) protection circuitry in the IC device 300. In some embodiments, a peak amplitude or peak voltage of AC voltage stimulus signal $V_s$ may be between 0.3 and 0.1V, between 0.3 and 0.65V, or between 0.3 and 0.45 V (all inclusive).

C3 represents capacitive coupling between adjacent bond wires, such as those connected to Pin 1 and Pin 2 as shown in FIG. 3A. In some embodiments, voltage stimulus may be applied to an individual pin of a device while the response current through the substrate is measured. This value represents a capacitance between bond wires adjacent to the bond wire attached to the stimulated pin. The response for each pin can be mapped and compared to a predetermined range to determine if there is latent defect related to bond wires. The response may be measured with a transimpedance amplifier $M_1$.

Referring to FIG. 3A, transimpedance amplifier $M_1$ is configured to convert a current 308 measured at a measurement input M into an output voltage $V_O$ that is proportional to the current 308 being measured. Measurement input M is coupled to an inverting input terminal of an operational amplifier (op-amp) 306, with the non-inverting input terminal of op-amp 306 coupled to a ground voltage. The output is coupled to the inverting input through feedback impedance $Z_f$. As a result of the feedback, the amplifier will reach a steady state in which the voltage at the inverting input equals that at the non-inverting input. As should be appreciated by a person of ordinary skill in the art, inputs to an op-amp draws a near zero amount of current and have the same potential voltage, thus measurement input M may be regarded as a "virtual ground" having the same potential as the ground voltage, while current $I_B$ into the inverting input terminal of op-amp 306 is negligible. Op-amp 306 and feedback impedance $Z_f$ are coupled together to form transimpedance amplifier $M_1$, such that the output voltage $V_o$ is proportional to the product of input current 308 and impedance $Z_f$.

To measure bond wire fringing capacitance C3 using the 2-wire configuration, stimulus output S is provided to a point in device 300, measurement input M is coupled to another point in device 300, and the AC impedance method is used to measure a capacitance value based on a current response measured at M. In the example shown in FIG. 3A, a stimulus signal is supplied by stimulus output S at Pin 1, while current 308 is measured at connection point 335 to the substrate, by transimpedance amplifier $M_1$.

The relationship between the value measured by transimpedance amplifier $M_1$ and the fringing capacitance might be understood as follows: In the example shown in FIG. 3A, measured current response 308 represents a combination of currents $I_{X1}$, $I_{X2}$, $I_{X3}$ that flows through C1, C2 and C3, respectively. An effective impedance $Z_{eff}$ may be measured from current response 308 based on the magnitude of the AC stimulus voltage signal at S. $Z_{eff}$ is related to C1 in parallel with the series combination of C2 and C3. Thus if C1 and C2 are known quantities based on, for example prior and separate measurements, the measured effective impedance $Z_{eff}$ may be used to infer the value of C3.

However, as noted above, it is not a requirement that the value of C3 be explicitly calculated. Rather, techniques as described herein may operate based on measurement of a value indicative of C3. Such a result can be achieved, for example, by comparing the measured current response to a current response expected when C3 is in a range corresponding to appropriately spaced bond wires or, conversely, to a range corresponding to bond wires that are close enough together to present an undesirably high risk of failure. The appropriate range or ranges may be determined by calculation and or measurement on known good devices. The appropriate range may be determined for each pair of bond wires. The ranges may also be adjusted for process variations, as described below in connection with FIG. 6, or for any other variables that may impact the range indicating an appropriate and/or inappropriate spacing between bond wires.

In some embodiments, the measurements may be adjusted for parasitic capacitance. For example, circuitry within $M_1$ and $S_1$ may present various parasitic capacitance within themselves. For example, even without $M_1$ and $S_1$ to test device 300 and by leaving measurement input M and stimulus output S floating, $M_1$ may measure a non-zero amount of AC current in response to an AC stimulus voltage signal $V_S$ in $S_1$. This is due to contribution from the parasitic capacitive coupling between $M_1$ and $S_1$, and may especially be noticeable when both $M_1$ and $S_1$ are integrated as part of one test system. In some embodiments, a baseline capacitance test without hooking up the device under test may be performed, and later subtracted when testing the device under test for bond wire capacitive coupling, in order to correct the background parasitic capacitance from the measurement apparatus itself.

As an example of another variation in the test techniques described herein, it should be appreciated that a stimulus signal may also be applied at a connection point that connects to the substrate, while measuring a current response via one or more pins of the device under test.

Figure 3B:
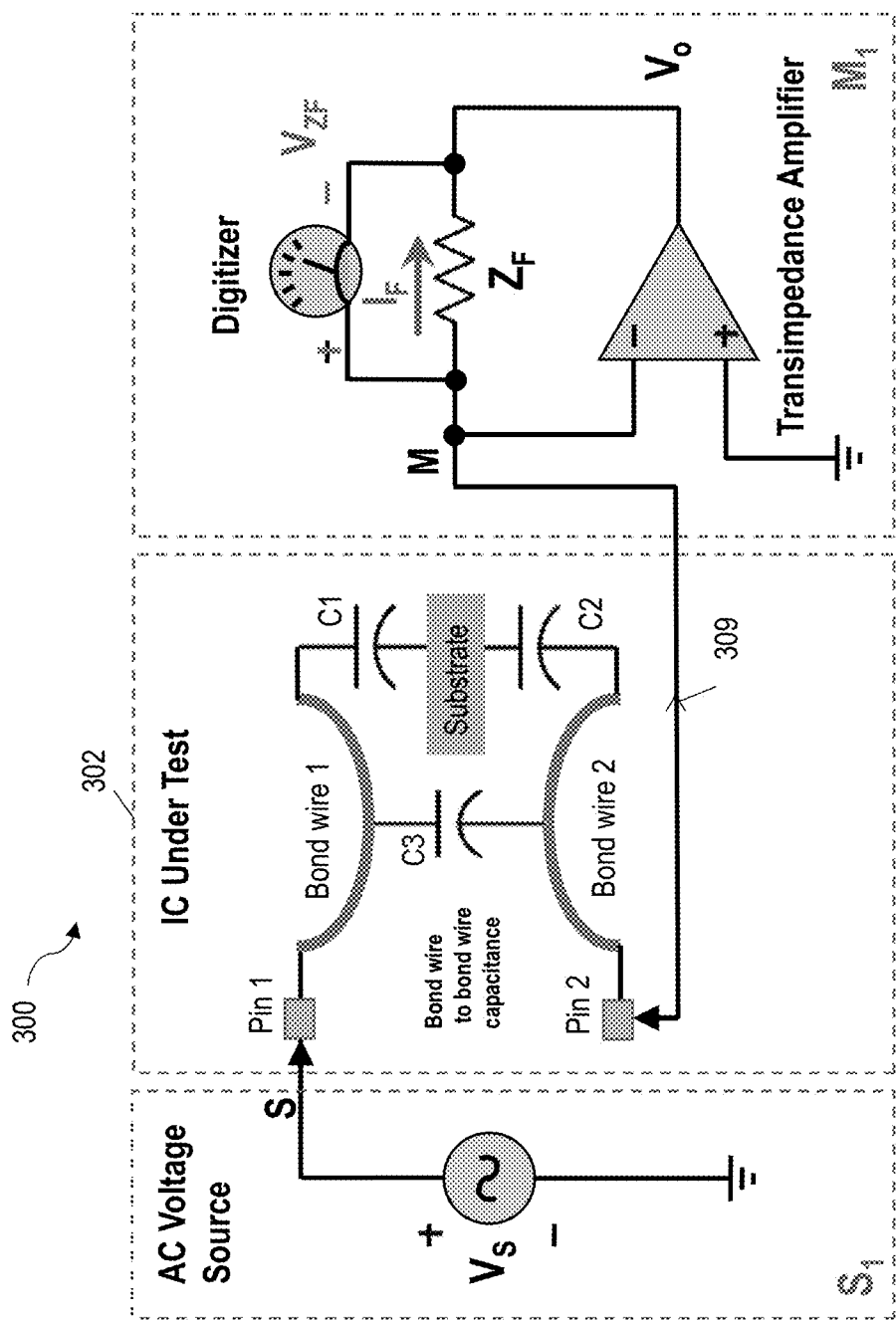
FIG. 3B is a schematic diagram that illustrates an exemplary variation of a method of operating a test system to identify a latent defect in a device, according to some aspects of the present application.

It should also be appreciated that it is not a requirement that the connection point 335 to the substrate is used for application of a stimulus signal or for measuring a current response. In another exemplary variation, the substrate may be left floating and both application of stimulus signal and measurement of current response are performed at the pins of the device under test. For example, FIG. 3B illustrates another 2-wire configuration for testing defects in device 300, where the substrate is floating. As shown in the exemplary configuration in FIG. 3B, a stimulus signal is supplied at Pin 1, while current response 309 is measured at Pin 2. Measured current response 309 represents a combination of currents that flows through C1, C2 and C3. An effective impedance $Z_{eff}$ may be measured from current response 309 based on the magnitude of the AC stimulus voltage signal at S. $Z_{eff}$ is related to C3 in parallel with the series combination of C1 and C2. Thus if C1 and C2 are known quantities based on, for example prior and separate measurements, the measured effective impedance $Z_{eff}$ may be used to infer the value of C3.

Figure 4A:
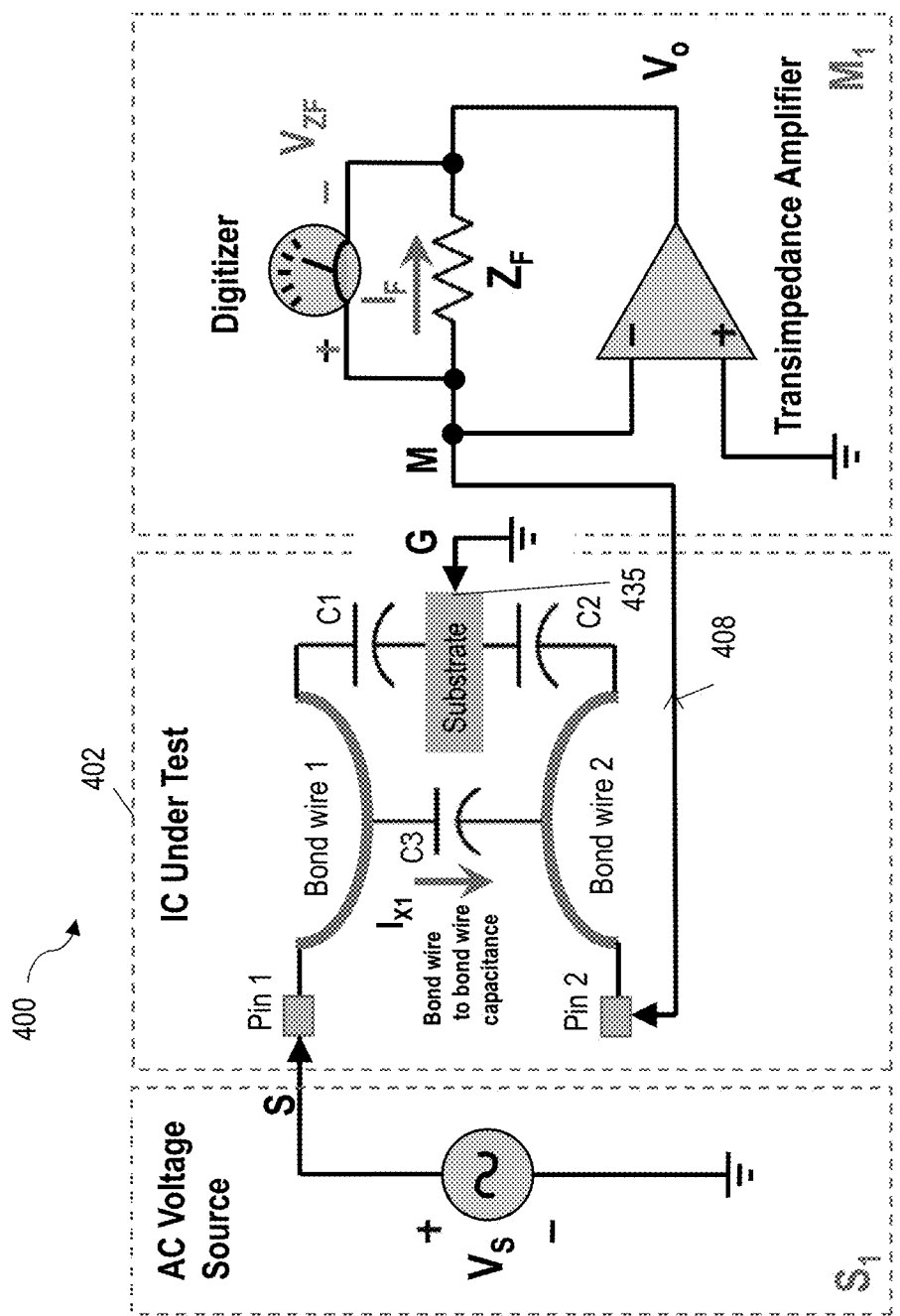
FIG. 4A is a schematic diagram that illustrates another exemplary implementation of a method of operating a test system to identify a latent defect in a device, according to some aspects of the present application.

FIG. 4A is a schematic diagram that illustrates another exemplary implementation of a method of operating a test system to identify a latent defect in a device, according to some aspects of the present application. FIG. 4A illustrates a 3-wire configuration for testing latent defects in a device 400, that may reduce or eliminate the effect of substrate capacitances C1 and C2 in the measurement of small fringing capacitance C3. The embodiment of FIG. 4A may use the same components described in connection with FIG. 3A to perform a measurement of a value indicative of C3. However, as can be seen by a comparison of FIG. 3A to FIG. 4, those components are connected differently to the device under test. Different ranges of measured value may indicate the presence or, conversely, the absence of a latent defect. However, the appropriate ranges may be determined and/or adjusted in similar ways.

In the example shown in FIG. 4A, an AC voltage stimulus signal $V_S$ is applied to Pin 1, while Pin 2 is coupled to measurement input M of the transimpedance amplifier $M_1$ to measure a response current 408 at Pin 2. A third point of connection on the device 400 is made at a connection point 435 to the Substrate. In some embodiments, connection point 435 is coupled to a reference voltage, such that the substrate is kept at a constant level at the reference voltage. In some embodiments, connection point 435 connects the substrate to a reference level. Connection point 435 may be directly coupled to a reference voltage level, represented as a ground, or in one example, connection point 435 may be coupled to a grounded guard node G on the package 402 of the device 400.

The reason that the measured current is indicative of C3 may be understood as follows: During testing of device 400, Pin 2 is coupled to virtual ground at measurement input M, and thus Pin 2 has the same ground potential as the Substrate. Thus, no current flows across C2. Current driven through capacitance C1 will flow into the grounded substrate, and not appear in the measured response current 408. When voltage stimulus signal $V_s$ is applied to Pin 1, current $I_{x1}$ is driven by $V_s$ to flow across the fringing capacitance C3 between Bond wire 1 and Bond wire 2. Because Pin 2 has the same potential as the substrate, $I_{x1}$ will continue flowing into Pin 2 and becomes the response current 408 that can be measured in whole by the transimpedance amplifier $M_1$. In other words, the measured response current 408 represents the entire $I_{x1}$ current through C3 as a response to an applied voltage stimulus signal $V_s$ across C3 via Pin 1 and Pin 2, without any contribution from the substrate capacitances C1 or C2.

When current $I_{x1}$ through C3 is measured, the value of C3 can be calculated using for example the AC impedance method based on the amplitude of applied voltage stimulus signal $V_s$. Therefore the configuration shown in FIG. 4A may be used to subtract out the effect of parasitic capacitance on a measured current and to directly measure the relatively small fringing capacitance C3 between two pins, and direct measurement of adjacent bond wires' capacitive coupling becomes possible. In comparison to the configuration of FIG. 3A, smaller values of fringing capacitance may be detected and/or more accurate capacitance measurements may be made. Since, in FIG. 4A, response current 408 at the input M of the transimpedance amplifier M1 represents only the small fringing capacitance C3, a higher front-end amplifier sensitivity may be used to amplify the response current 408 and improve the signal amplitude of output voltage $V_o$. For example, in connection with FIG. 4A, the transimpedance amplifier may have a front-end sensitivity in the range of 1 to 10 V/A (inclusive), whereas, in connection with FIG. 3A, the transimpedance amplifier may have a front-end sensitivity of 0.1 to 1 V/A (inclusive). In some embodiments, fringing capacitance values may be resolvable down to a range of between 10 fF and 50 pF, between 20 fF and 20 pF, or between 20 fF and 10 pF.

The inventor has recognized and appreciated that the 3-wire configuration as illustrated in FIG. 4A and the 2-wire configuration as illustrated in FIG. 3A may each have certain unique advantages for testing latent defects. For example, in 2-wire configuration, background parasitic capacitance variation between testing at different pins may affect the accuracy of fringing capacitance tested at the different pins, while in 3-wire configuration, parasitic capacitance does not affect the measurement. Further and without wishing to be bound by a particular theory, with 2-wire configuration, as only one pin is tested at a time, there is no need to obtain information as to which bond wires are proximate to each other inside the package, while with 3-wire configuration, a pin pair are tested, and prior knowledge on how the pins correspond to locations of bond wires within the device under test would be needed to verify that the fringing capacitance tested through the pair of pins correspond to bond wires that are located next to each other.

Figure 4B:
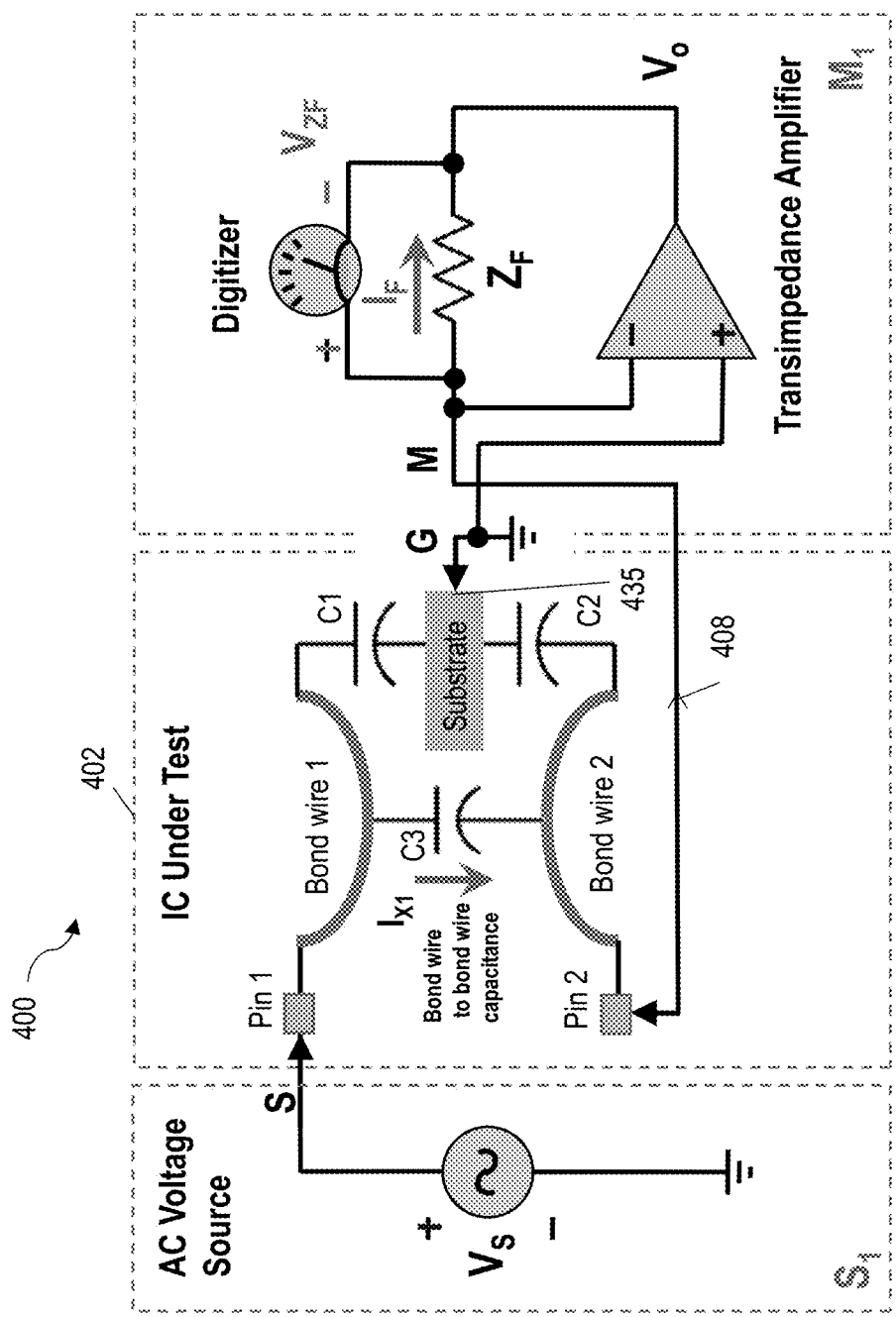
FIG. 4B is a schematic diagram that illustrates another exemplary implementation of a method of operating a test system to identify a latent defect in a device, according to some aspects of the present application.

FIG. 4B is a schematic diagram that illustrates another exemplary implementation of a method of operating a test system to identify a latent defect in a device, according to some aspects of the present application. FIG. 4B illustrates a variation of 3-wire configuration for testing latent defects in a device 400 that is similar in many aspects to the configuration as shown in FIG. 4A. The embodiment of FIG. 4B may use the same components described in connection with FIG. 4A to perform a measurement of a value indicative of C3. However, as can be seen by a comparison of FIG. 4B to FIG. 4A, those components are connected differently to the device under test. Different ranges of measured value may indicate the presence or, conversely, the absence of a latent defect. However, the appropriate ranges may be determined and/or adjusted in similar ways.

In the example shown in FIG. 4B, the ground guard node G is coupled to an input of the transimpedance amplifier, for example the non-inverting input as illustrated in FIG. 4B, to make the potentials between G and M equal. In some embodiments, connecting guard node G to the non-inverting input of the transimpedance amplifier may be referred to as remote guard sense configuration, as the non-inverting input of the transimpedance amplifier is remotely sensing the ground or other reference potential on the guard node G. According to an aspect of the present application, remote sensing of the guard node G may help eliminate the effect of AC voltage drop based on IR or jwL based on a finite impedance at the connection between the guard node G and ground, such that a voltage across C2 will be forced to be substantially 0.

Figure 5:
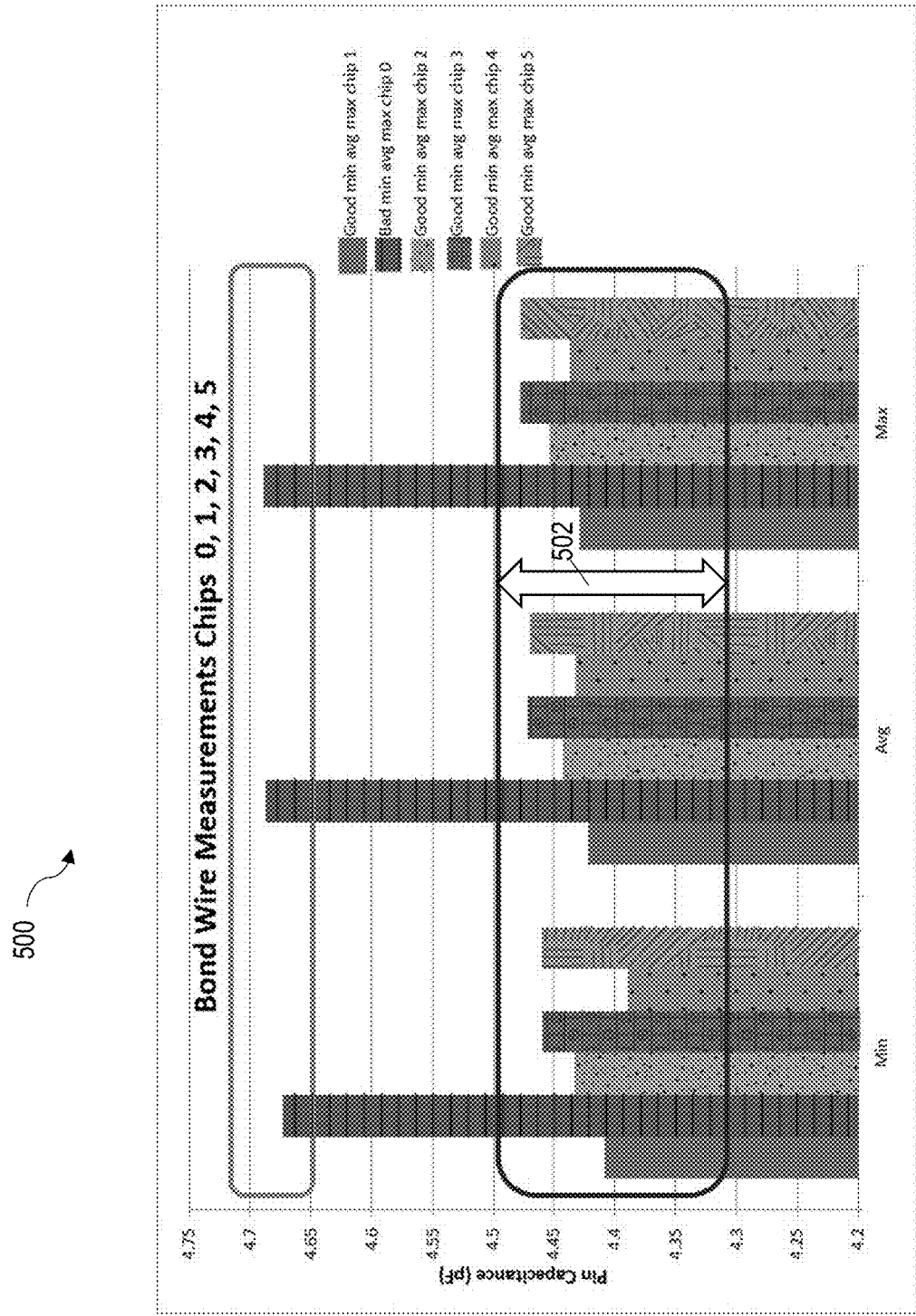
FIG. 5 is a data bar chart illustrating a series of measured pin capacitances and an example of a predetermined range of capacitance couplings, according to some aspects of the present application.

FIG. 5 is a bar chart illustrating a series of measured pin capacitance and an example of a predetermined range of capacitance couplings, according to some aspects of the present application. The measurements are made in a 2-wire unguarded configuration, similar to the configuration shown in FIG. 3A, for the same pin on each of six chips, all of which were designed and manufactured according to the same process. The clusters show, for each of the six chips, the minimum, average and maximum value of the capacitance measured, where Min is the minimum value for each of the 6 chip measurements, Max is the largest recorded measurement for the pin for all devices. The measured capacitance values represent the combination of capacitances C1, C2 and C3 as illustrated in FIG. 3A and discussed above.

In this example, none of the chips have a hard short or open for those pins, but one, designated Chip 0, has a latent defect. FIG. 5 illustrates that the chip with a latent defect can be readily distinguished from the good chips. FIG. 5 shows a predetermined range 502, which in this example is between about 4.3 and 4.5 pF, within which the device may be considered to be free of latent defect and unlikely to fail. The predetermined range 502 may be set as a static range that encompasses the values of measured capacitances between pin pairs in a number of known good devices, for example chip 1, 2, 3, 4 and 5 as shown in FIG. 5. FIG. 5 also shows a known bad chip 0 with bond wire near-shorted that have measured pin capacitances of between 4.65 and 4.7 pF, outside the predetermined range 502.

Data, as shown in FIG. 5, illustrates an approach to set a predetermined range against which to compare values indicative of fringing capacitance between bond wires in order to determine whether there is a latent defect involving those bond wires. The difference between the good and a chip with a latent defect is stable and repeatable. Accordingly, by measuring a sufficient number of chips, an acceptable range may be determined, a range representative of a defect, or a threshold between measurements reflecting good and defective chips may be selected. That range may be expressed as a capacitance, as shown in FIG. 5. However, as described in connection with both FIG. 3A and FIG. 4A, a response, representative of the fringing capacitance, may be measured as a voltage, which represents a current flow. The ranges and/or threshold may be presented as a measured current and/or voltage instead of being converted to a capacitance.

Figure 6:
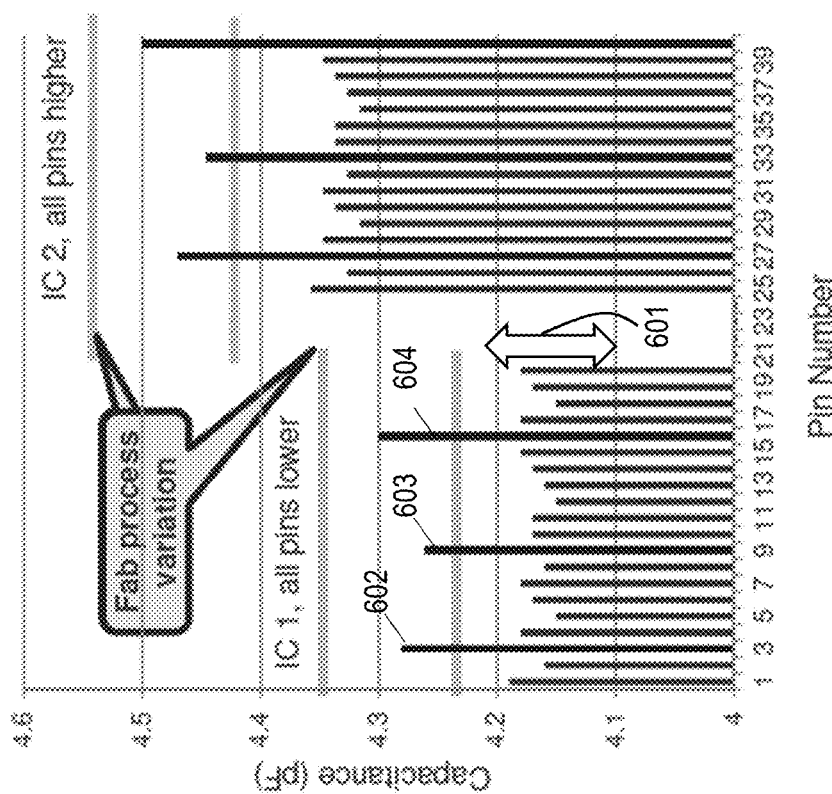
FIG. 6 is a data bar chart illustrating a series of measured pin capacitance on two devices, according to some aspects of the present application.

FIG. 6 is a bar chart illustrating an approach to adapting the ranges and/or threshold applicable to a specific IC device. The inventor has recognized and appreciated that IC devices may have systematic variations in characteristic parameters such as resistance, capacitances between devices due for example to manufacturing batch variations. Those variations may be compensated for. FIG. 6 illustrates a series of measured pin capacitance on two devices, which were measured using techniques as described herein.

As shown in FIG. 6, within device IC1, pin capacitance measurements are systematically lower than pin capacitance measurements within device IC2. Such a pattern of variation may result from process variations within a semiconductor fabrication facility such that IC devices manufactured at different times have different characteristics. To tolerate such process variation from device to device, the capacitive couplings between bond wires of different IC devices may be normalized to a reference IC device, prior to determining if the measured capacitive couplings are within a predetermined range. Alternatively, the predetermined ranges may be normalized, as the resulting comparison would be similarly normalized. FIG. 6 illustrates how such a normalization may be performed.

FIG. 6 illustrates pin capacitances for multiple pins on each of two IC devices, designated IC1 and IC2. The measurements are made using techniques as described herein such that the pin capacitances indicate the fringing capacitance associated with bond wires connected to the measured pins as well as the parasitic capacitances C1 and C2 in FIG. 3 In FIG. 6, IC1 may be a reference IC device with a predetermined range of good pin capacitance values 601 based on the measured pin fringing capacitances. The good pin capacitance values may be determined, for example by first identifying outliers 602, 603, 604. Any suitable statistical method may be used to select outliers, for example as values that are several standard deviations above the average. The predetermined range of good pin capacitance 601 for IC1 may then be chosen based on a statistical distribution of the rest of the pin capacitance values that are not outliers.

IC1 may represent IC devices used to determine the ranges against which to compare measured values representative of fringing capacitance to determine whether an IC device has a latent defect. IC2, in contrast, may represent an IC device manufactured at a different time such that the measured values of fringing capacitances are different for good bond wire pairs. Nonetheless, measured values for chip IC2 may be compared to those for IC1 via a normalization process.

After IC2's pin capacitance values are measured, each of the measured IC2 pin capacitances may be normalized relative to IC1. Normalization may be performed by, for example, scaling the IC2 pin capacitance with a ratio between the average pin capacitance of IC2 and IC1. However, it should be appreciated that any suitable scaling method to compensate for the systematically higher pin capacitance in IC2 may be used.

Further, it should be appreciated that normalization may be used in determining ranges and/or thresholds that differentiate good bond wires and those with latent defects. For example, a nominal average pin capacitance value of an IC device may be established. For each device used as a reference device to determine the predetermined range and/or threshold, pin capacitance may be measured. The average pin capacitance may be computed for the IC device and a scale factor, between the measured average and the nominal average may be computed. This scale factor may be applied to all measured values such that the average for the IC device equals the nominal average. These normalized values may be combined with normalized values for other IC devices to determine ranges and/or thresholds between normalized values differentiating between good bond wires and those with latent defects. For normalization, capacitances measured at all pins of a device may be used. Alternatively, a subset of the pins of an IC device may be used for normalization.

Figure 7:
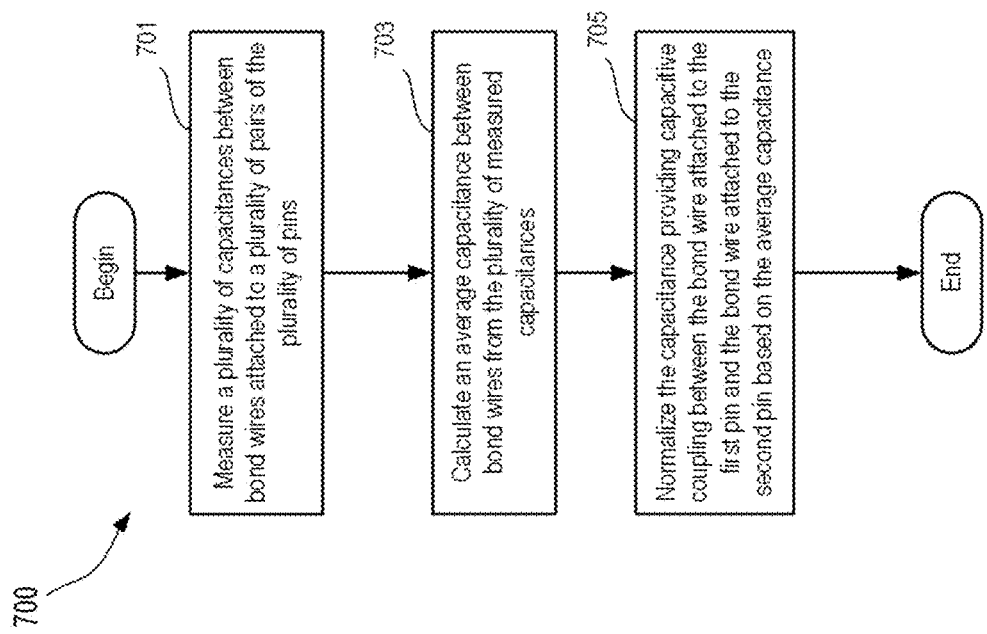
FIG. 7 is a schematic flow diagram illustrating an exemplary method 700 for a selecting a predetermined range of capacitance, according to some aspects of the present application.

FIG. 7 is a schematic flow diagram illustrating an exemplary method 700 for a selecting a predetermined range of capacitance, according to some aspects of the present application. Method 700 may, according to some aspects, be an exemplary implementation of act 207 in method 200A of FIG. 2A. At act 701, method 700 comprises measuring a plurality of capacitances between bond wires attached to a plurality of pairs of the plurality of pins. At act 703, method 700 comprises calculating an average capacitance between bond wires from the plurality of measured capacitances. At act 705, method 700 comprises normalizing the capacitance providing capacitive coupling between the bond wire attached to the first pin and the bond wire attached to the second pin based on the average capacitance.

Having thus described several aspects of at least one embodiment of this invention, it is to be appreciated that various alterations, modifications, and improvements will readily occur to those skilled in the art.

For example, although chip package level testing is described, the described testing method may also apply to printed circuit board (PCB) level testing, with one or more IC chips already mounted on the PCB.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of operating a test system to identify a latent defect in a device comprising a plurality of pins having bond wires attached thereto, the method comprising:
supplying a stimulus signal to the device;
measuring a response to the stimulus signal, the response indicating capacitive coupling between a bond wire attached to a first pin of the plurality of pins and a bond wire attached to a second pin of the plurality of pins;
determining whether a capacitance providing the capacitive coupling is within a predetermined range; and
when the capacitance is determined to be outside the predetermined range, providing an indication that the device is likely to fail.

2. The method of claim 1, wherein supplying a stimulus signal comprises supplying a stimulus signal at the first pin.

3. The method of claim 1, wherein:
the device further comprises a substrate and a connection point to the substrate, and
measuring the response comprises measuring a current at the connection point to the substrate.

4. The method of claim 1, wherein measuring the response comprises measuring a current at the second pin.

5. The method of claim 4, wherein:
the device further comprises a substrate and a connection point to the substrate,
the method further comprises coupling the connection point to a reference voltage.

6. The method of claim 5, wherein the second pin is configured to have the same potential as the connection point to the substrate.

7. The method of claim 1, wherein:
the device further comprises a package, the plurality of pins are disposed on the package, and
the bond wire attached to the first pin is adjacent to the bond wire attached to the second pin.

8. The method of claim 1, wherein the predetermined range has an upper bound of less than 10 pF.

9. The method of claim 6, wherein measuring the current comprises coupling an input of a transimpedance amplifier to the second pin, and outputting from the transimpedance amplifier an output voltage representing the current.

10. The method of claim 9, wherein measuring the current further comprises coupling a reference input of the transimpedance amplifier to the connection point.

11. The method of claim 1, wherein the stimulus signal is a sinusoidal voltage signal with a first frequency of between 1 and 500 kHz.

12. The method of claim 1, wherein the stimulus signal is a sinusoidal voltage signal with a peak voltage of between 0.1V to 0.75 V.

13. The method of claim 1, wherein:
the device is a first device, and
the method further comprises measuring a baseline capacitance between a first pin and a second pin of a plurality of pins of a plurality of second devices; and
determining the predetermined range from the measured baseline capacitances.

14. The method of claim 1, further comprising:
measuring a plurality of capacitances between bond wires attached to a plurality of pairs of the plurality of pins;
calculating an average capacitance between bond wires from the plurality of measured capacitances; and
normalizing the capacitance providing capacitive coupling between the bond wire attached to the first pin and the bond wire attached to the second pin based on the average capacitance.

15. The method of claim 1, further comprising:
testing the device to identify hard shorts and hard opens between the first pin of the plurality of pins and the second pin of the plurality of pins, wherein
the supplying and the measuring are performed subsequent to when the testing does not identify hard shorts or hard opens.

16. The method of claim 1, wherein the first pin and the second pin form a pair of a plurality of pairs of the plurality of pins, and the method further comprises:
testing for latent defects by, for each pair of the plurality of pairs of pins:
measuring a fringing capacitance between a bond wire attached to a first pin of the pair and a bond wire attached to a second pin of the pair; and
determining whether the fringing capacitance is within a predetermined range; and
when the fringing capacitance for a pair of the plurality of pairs is determined to be outside the predetermined range, providing an indication that the device has a latent defect.

17. At least one non-transitory computer-readable medium encoded with computer-executable instructions that, when executed by a processor of a test system, controls the processor to perform a method of operating a test system to identify a latent defect in a device comprising a plurality of pins having bond wires attached thereto, the method comprising:
for each of a plurality of pairs of the plurality of pins:
configuring the test system to measure capacitance for a first pin and a second pin of the pair, the configuring comprising connecting an AC voltage source to the first pin of the pair;
measuring a current flow induced by the AC voltage source;
computing a capacitance providing capacitive coupling between a bond wire attached to the first pin and a bond wire attached to a second pin;
determining whether the capacitance is within a predetermined range; and
when the capacitance is determined to be outside the predetermined range, providing an indication that the device has a latent defect.

18. The method of claim 17, wherein:
the device is a first device, and
the method further comprises measuring a baseline capacitance between a first pin and a second pin of a plurality of pins of a plurality of second devices; and
determining the predetermined range from the measured baseline capacitances.

19. The method of claim 17, further comprising:
measuring a plurality of capacitances between bond wires attached to a plurality of pairs of the plurality of pins;
calculating an average capacitance between bond wires from the plurality of measured capacitances; and
normalizing the capacitance providing capacitive coupling between the bond wire attached to the first pin and the bond wire attached to the second pin based on the average capacitance.

* * * * *